US011927645B2

(12) United States Patent
Stoica et al.

(10) Patent No.: US 11,927,645 B2
(45) Date of Patent: Mar. 12, 2024

(54) DETECTING SENSITIVITY FAULTS IN CAPACITIVE SENSORS BY USING PULL-IN FUNCTIONALITY

(71) Applicant: Infineon Technologies AG, Neubiberg (DE)

(72) Inventors: Dan-Ioan-Dumitru Stoica, Buchare (RO); Cesare Buffa, Villach (AT); Alessandro Caspani, Villach (AT); Constantin Crisu, Bucharest (RO); Victor Popescu-Stroe, Bucharest (RO); Bernhard Winkler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 17/463,753

(22) Filed: Sep. 1, 2021

(65) Prior Publication Data

US 2023/0064937 A1 Mar. 2, 2023

(51) Int. Cl.
| | | |
|---|---|---|
| *G01R 31/64* | (2020.01) | |
| *G01H 11/06* | (2006.01) | |
| *G01L 9/12* | (2006.01) | |
| *G01R 27/26* | (2006.01) | |
| *G01R 35/00* | (2006.01) | |

(52) U.S. Cl.
CPC ......... *G01R 31/64* (2020.01); *G01R 27/2605* (2013.01); *G01R 35/00* (2013.01); *G01H 11/06* (2013.01); *G01L 9/12* (2013.01)

(58) Field of Classification Search
CPC .... G01R 31/64; G01R 27/2605; G01R 35/00; G01H 11/06; G01L 9/12
See application file for complete search history.

(56) References Cited

U.S. PATENT DOCUMENTS

| | | | | |
|---|---|---|---|---|
| 5,194,819 A | * | 3/1993 | Briefer ..................... | G01G 7/06 324/684 |
| 8,963,659 B1 | * | 2/2015 | Goldsmith ......... | H01H 59/0009 335/78 |

(Continued)

FOREIGN PATENT DOCUMENTS

| | | | | |
|---|---|---|---|---|
| CN | 105593158 | * | 5/2016 | ........... B81C 99/003 |
| DE | 102015003320 | * | 3/2015 | ........... H03K 17/955 |

(Continued)

*Primary Examiner* — Alexander Satanovsky
*Assistant Examiner* — Sharah Zaab
(74) *Attorney, Agent, or Firm* — Harrity & Harrity, LLP

(57) ABSTRACT

A capacitive sensor includes a first electrode structure; a second electrode structure that is counter to the first electrode structure, wherein the second electrode structure is movable relative to the first electrode structure and is capacitively coupled to the first electrode structure to form a capacitor having a capacitance that changes with a change in a distance between the first electrode structure and second electrode structure; a signal generator configured to apply an electrical signal at an input or at an output of the capacitor to induce a voltage transient response at the output of capacitor; and a diagnostic circuit configured to detect a fault in the capacitive sensor by measuring a time constant of the first voltage transient response and detecting the fault based on the time constant and based on whether the first electrical signal is the pull-in signal or the non-pull-in signal.

26 Claims, 11 Drawing Sheets

(56) References Cited

U.S. PATENT DOCUMENTS

| | | | | |
|---|---|---|---|---|
| 2002/0033048 A1* | 3/2002 | McIntosh | ............... | G01L 9/12 |
| | | | | 361/115 |
| 2011/0056302 A1* | 3/2011 | Lutz | ............... | G01L 9/12 |
| | | | | 73/724 |
| 2014/0125359 A1* | 5/2014 | El-Gamal | ............... | G01L 9/12 |
| | | | | 324/664 |
| 2014/0266263 A1* | 9/2014 | Wurzinger | ............... | H04R 19/005 |
| | | | | 324/686 |

FOREIGN PATENT DOCUMENTS

| | | | | | |
|---|---|---|---|---|---|
| JP | 2005030901 | * | 2/2005 | ............... | G01B 7/28 |
| WO | WO2006000621 | * | 1/2006 | ............... | G01P 1/006 |

\* cited by examiner

DETECTING SENSITIVITY FAULTS IN CAPACITIVE SENSORS BY USING PULL-IN FUNCTIONALITY

BACKGROUND

Capacitive sensors have many applications and may be used as pressure sensors, acoustic sensors, microphone sensors, and the like. A capacitive sensor may be a microelectromechanical system (MEMS) capacitive sensor with a flexible membrane in any of the aforementioned applications. The flexible membrane is typically configured as one of the conductors of a capacitor that moves towards or away from the other conductor based on the sensed physical quantity (e.g., pressure, acoustic waves, vibrations, etc.).

Sensitivity faults are known failure modes in capacitive sensors. For example, sensitivity faults may occur due to a weaking (i.e., a softening) of the membrane, a stiffening (i.e., hardening) of the membrane, changes in MEMS asymmetry, and/or the presence of non-conductive particles between the conductor structures of the capacitor. The sensitivity faults described above can result in a change in capacitance of the capacitive sensor and/or a change in the voltage dependency of the capacitance (i.e., the sensor sensitivity). When a sensitivity fault is present, the sensor functionality can be impaired via a change in the desired sensor sensitivity and/or increased noise level.

Therefore, an improved device capable of detecting and diagnosis of sensitivity faults in capacitive sensors may be desirable.

SUMMARY

Embodiments provide a capacitive sensor, including: a first electrode structure; a second electrode structure that is counter to the first electrode structure, wherein the second electrode structure is movable relative to the first electrode structure in response to an external force acting thereon, wherein the second electrode structure is capacitively coupled to the first electrode structure to form a first capacitor having a first capacitance that changes with a change in a distance between the first electrode structure and second electrode structure, wherein the first capacitance is representative of the external force, wherein a pull-in event occurs when the first electrode structure is in direct contact with the second electrode structure causing the first capacitance to be equal to or greater than a pull-in capacitance and a non-pull-in event occurs when the first electrode structure is not in direct contact with the second electrode structure causing the first capacitance to be less than the pull-in capacitance; a signal generator configured to apply a first electrical signal at an input or at an output of the first capacitor to induce a first voltage transient response at the output of first capacitor, wherein the first electrical signal step is a pull-in signal configured to induce a pull-in event in the absence of a fault or a non-pull-in signal configured induce a non-pull-in event in the absence of a fault; and a diagnostic circuit configured to detect a fault in the capacitive sensor by measuring a first time constant of the first voltage transient response and detecting the fault based on the first time constant and based on whether the first electrical signal is the pull-in signal or the non-pull-in signal.

Embodiments provide a capacitive sensor, including: a first electrode structure; a second electrode structure that is counter to the first electrode structure, wherein the second electrode structure is movable relative to the first electrode structure in response to an external force acting thereon, wherein the second electrode structure is capacitively coupled to the first electrode structure to form a first capacitor having a first capacitance that changes with a change in a distance between the first electrode structure and second electrode structure, wherein the first capacitance is representative of the external force, wherein a pull-in event occurs when the first electrode structure is in direct contact with the second electrode structure causing the first capacitance to be equal to or greater than a pull-in capacitance and a non-pull-in event occurs when the first electrode structure is not in direct contact with the second electrode structure causing the first capacitance to be less than the pull-in capacitance; a signal generator configured to apply an alternating current (AC) signal at the first electrode structure or the second electrode structure of the first capacitor to induce an output response at the output of first capacitor, wherein the AC signal is a pull-in signal configured to induce a pull-in event in the absence of a fault or a non-pull-in signal configured induce a non-pull-in event in the absence of a fault; and a diagnostic circuit configured to detect a fault in the capacitive sensor by evaluating the output response and detecting the fault based on the output response and based on whether the AC signal is the pull-in signal or the non-pull-in signal.

Embodiments provide a capacitive sensor, including: a first electrode structure; a second electrode structure that is counter to the first electrode structure, wherein the second electrode structure is movable relative to the first electrode structure, wherein the second electrode structure is capacitively coupled to the first electrode structure to form a first capacitor having a first capacitance that changes with a change in a distance between the first electrode structure and second electrode structure; a third electrode structure that is counter to the first electrode structure, wherein the third electrode structure is movable relative to the first electrode structure, wherein the third electrode structure is capacitively coupled to the first electrode structure to form a second capacitor having a second capacitance that changes with a change in a distance between the first electrode structure and third electrode structure, wherein a pull-in event occurs when the first electrode structure is in direct contact with the second electrode structure causing the first capacitance to be equal to or greater than a pull-in capacitance or when the third electrode structure is in direct contact with the second electrode structure causing the second capacitance to be equal to or greater than the pull-in capacitance, wherein a non-pull-in event occurs when the first electrode structure is not in direct contact with the second electrode structure causing the first capacitance to be less than the pull-in capacitance and when the third electrode structure is not in direct contact with the second electrode structure causing the second capacitance to be less than the pull-in capacitance; a differential amplifier configured to receive a first output signal from the first capacitor and a second output signal from the second capacitor, and generate a differential signal based on a difference between the first output signal and the second output signal; a signal generator configured to apply an AC signal at an input or at an output of the first capacitor and at an input or at an output of the second capacitor to induce a first output response at the output of the first capacitor and to induce a second output response at the output of the second capacitor, respectively; and a diagnostic circuit configured to detect a fault in the capacitive sensor by evaluating the differential signal and detecting the fault based on the differential signal and based on whether the AC signal is the pull-in signal or the non-pull-in signal.

BRIEF DESCRIPTION OF THE DRAWINGS

Embodiments are described herein making reference to the appended drawings.

DETAILED DESCRIPTION

Figure 1:
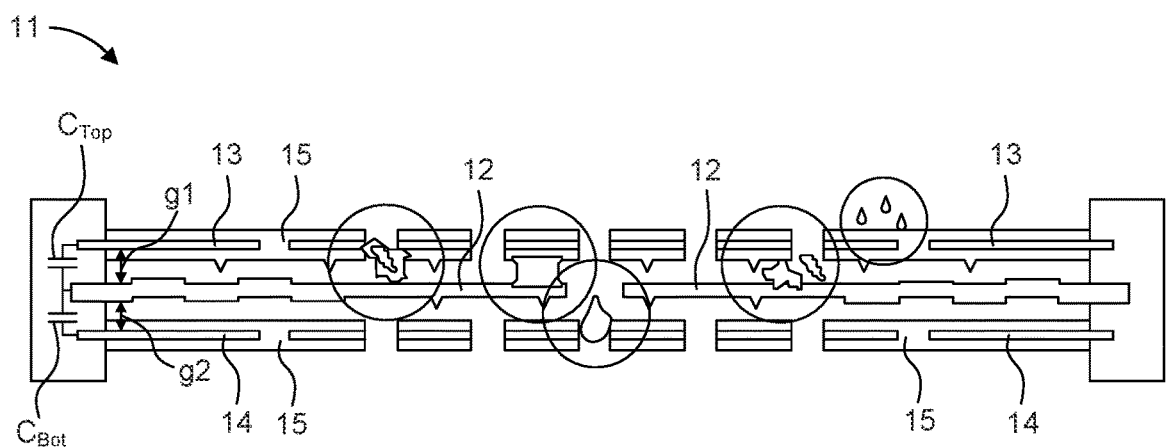
FIG. 1 shows a cross-section view of a MEMS element of a capacitive sensor according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller to perform the steps of a method.

A signal processing circuit and/or a signal conditioning circuit may receive one or more signals from one or more components and perform signal conditioning or signal processing thereon, which may result in one or more further signals being generated or adapted. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a DSP that performs some processing on the digital signal.

Embodiments are directed to the diagnosis of electrical failures in capacitive sensors, and more precisely the diagnosis of capacitive and sensitivity faults in micro-electromechanical system (MEMS) capacitive sensors, which are some of the critical failure modes of this device. The diagnosis may be applied any capacitive sensor, including single capacitive sensors or those that use two capacitors (e.g., a top capacitor $C_{Top}$ and a bottom capacitor $C_{Bot}$) for sensing and generating measurements signals representative of the physical quantity (e.g., pressure, acoustic waves, vibrations, or any other alternating current (AC) external force) being measured by the capacitive sensor.

The diagnostic circuit performs its diagnosis by measuring some selected electrical parameter of the MEMS capacitive sensor, such as a one or more time constants thereof, and then supplies this information as an output diagnosis. Capacitive or sensitivity fault, if present, will result either in a shift in one or more of the time constants that exceeds a tolerance range or threshold. The diagnostic circuit is configured to measure time constants, and, once they exceed a tolerance range supply this information as an output diagnosis (e.g., as a fault indicator).

FIG. 1 shows cross-section views of a MEMS element of a capacitive sensor according to one or more embodiments. In particular, FIG. 1 shows a MEMS element 11 of a dual plate capacitive sensor that may be implemented as a MEMS microphone, but the embodiments are not limited thereto. For example, MEMS capacitive sensors may also be used as pressure sensors.

The MEMS element 11 of the dual plate capacitive sensor includes three electrodes, including one conductive membrane 12 and two conductive plates 13 and 14. The membrane 12 is movable and the two conductive plates 13 and 14 may be movably fixed in a stationary position. In other embodiments, one or more of the plates 13 and 14 may also be movable.

A top capacitor CTop is formed between the top plate 13 and the membrane 12 and a bottom capacitor CBot is formed between the bottom plate 14 and the membrane 12. As the distance (i.e., thickness of gap g1 or g2) between respective electrodes changes in response to an external force (e.g., pressure or acoustic waves (sound)) applied to the movable conductive structure (e.g., the membrane 12), the capacitance of each capacitor CTop and CBot changes. For example, capacitance is calculated according to the formula Q=CV, where Q is the charge in coulombs, C is the capacitance in farads, and V is the potential difference between the electrodes of the capacitor in volts.

Different types of read-out circuits may be used to measure the change in capacitance. For example, a read-out circuit may utilize constant change readout during which the voltage V is measured while the charge Q is held constant. The change in capacitance caused by the thickness of gaps g1 and g2 changing causes the voltages Vtop and Vbot stored across the capacitors to change, and a measurement circuit may measure these voltages as sensor signals. Specifically, the voltage across each capacitor CTop and CBot represents a sensor signal that can be measured by a readout circuit and correlated into a physical quantity such as pressure or acoustic waves (sound). Thus, the voltage is the variable to be measured. Each capacitor may be read out independently or a common mode buffer may be used to read out an averaged value of the capacitors.

In the present example, the membrane 12 may move closer to one plate as it moves further from the other plate, thereby changing the capacitance of each capacitor CTop and CBot. The movement of the membrane 12 is cause by an external force (e.g., pressure or acoustic waves (sound), or vibration) applied to the membrane 12. These external forces are oscillating or AC external forces that that changes in polarity or direction over time.

It will also be appreciated that the embodiments are not limited to dual plate capacitive sensors but may also apply to single capacitor sensors consisting of two electrodes or capacitive sensors with two or more capacitors, including dual capacitive sensors where the two outside electrodes are movable and the middle electrode is movably fixed. Regardless of the type of capacitive sensor, at least two electrodes are used to form at least one capacitor. Each capacitor is thereby formed by two electrodes, at least one of which is moveable relative to the other in response to an external force being applied thereto. One electrode of a capacitor may be referred to as a reference electrode, whereas the other electrode of a capacitor may be referred to as a counter electrode.

An isolation material 15 is also provided to provide electrical isolation between the conductive elements 12, 13, and 14. In this example, the isolation material 15 encapsulates the top plate 13 and the bottom plate 14. At the very least, the isolation material 15 is formed on a surface of the top plate 13 that faces the membrane 12 such that the isolation material 15 can provide electrical isolation between the top plate 13 and the membrane 12, particularly when a pull-in event occurs with respect to the top capacitor CTop. Likewise, the isolation material 15 is formed on a surface of the bottom plate 14 that faces the membrane 12 such that the isolation material 15 can provide electrical isolation between the top plate 13 and the membrane 12, particularly when a pull-in event occurs with respect to the bottom capacitor CBot. Thus, it can be said that the isolation material 15 and the top plate 13 form a first electrode structure and the isolation material 15 and the bottom plate 13 form a second electrode structure. The membrane 12 is also a movable electrode structure counter to other electrode structures.

A pull-in event is defined when a voltage applied to at least one of the terminals of capacitor CTop or CBot is at a sufficient level (e.g., a high level or a low level depending on the injection location) to cause the membrane 12 to be "pulled-in" into contact with one of the electrode structures. In other words, a sufficiently high voltage (e.g., one that is greater than a predetermined pull-in threshold—if increased signal is applied at the Vbias node in FIG. 3A) or a sufficiently low voltage (e.g., one that is less than a predetermined pull-in threshold—if decreased signal is applied at the Vref1 node in FIG. 3A) induces an attractive force that causes a deflection of the membrane 12 towards the top plate 13 or towards the bottom plate 14.

A pull-in event with the first electrode structure occurs when the membrane 12 is pulled into direct contact with the isolation material 15 attached to the top plate 13. This results in a maximum capacitive value for capacitor CTop since the distance between the conductive elements 12 and 13 is at a minimum possible distance. Similarly, a pull-in event with the second electrode structure occurs when the membrane 12 is pulled into direct contact with the isolation material 15 attached to the bottom plate 14. This results in maximum capacitive value for capacitor CBot since the distance between the conductive elements 12 and 14 is at a minimum possible distance.

In general, a pull-in event occurs when an electrode structure is in direct contact with another electrode structure causing the capacitance of the two electrode structures to be equal to or greater than a pull-in capacitance and a non-pull-in event occurs when an electrode structure is not in direct contact with another second electrode structure causing the capacitance of the two electrode structures to be less than the pull-in capacitance.

Non-conductive materials may penetrate the MEMS element 11 and interfere with sensitivity one or both capacitors. Changes in the flexibility of the membrane 12 (i.e., a softening or stiffening), for example, due to aging or damage, may also lead to changes in the sensitivity such that measurements are no longer in specification and, thus, unreliable. The sensitivity faults described above also result in a pull-in voltage change (pull-in voltage is the voltage at which the MEMS plates crash one onto other resulting in complete loss of sensitivity). The following embodiments provide additional readout circuitry used to detect sensitivity faults and possibly compensate for the detected faults to restore or otherwise improve the functionality of the capacitive sensor.

Figure 2:
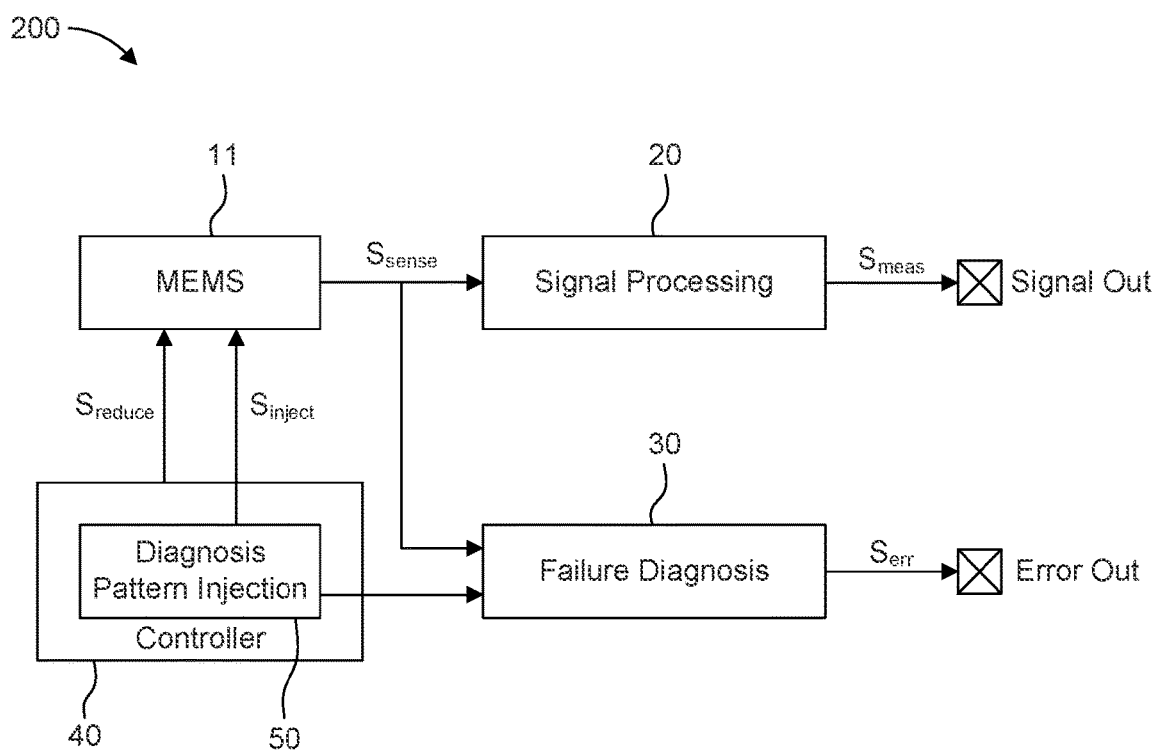
FIG. 2 is a block diagram of a capacitive sensor according to one or more embodiments.
Figure 3A:
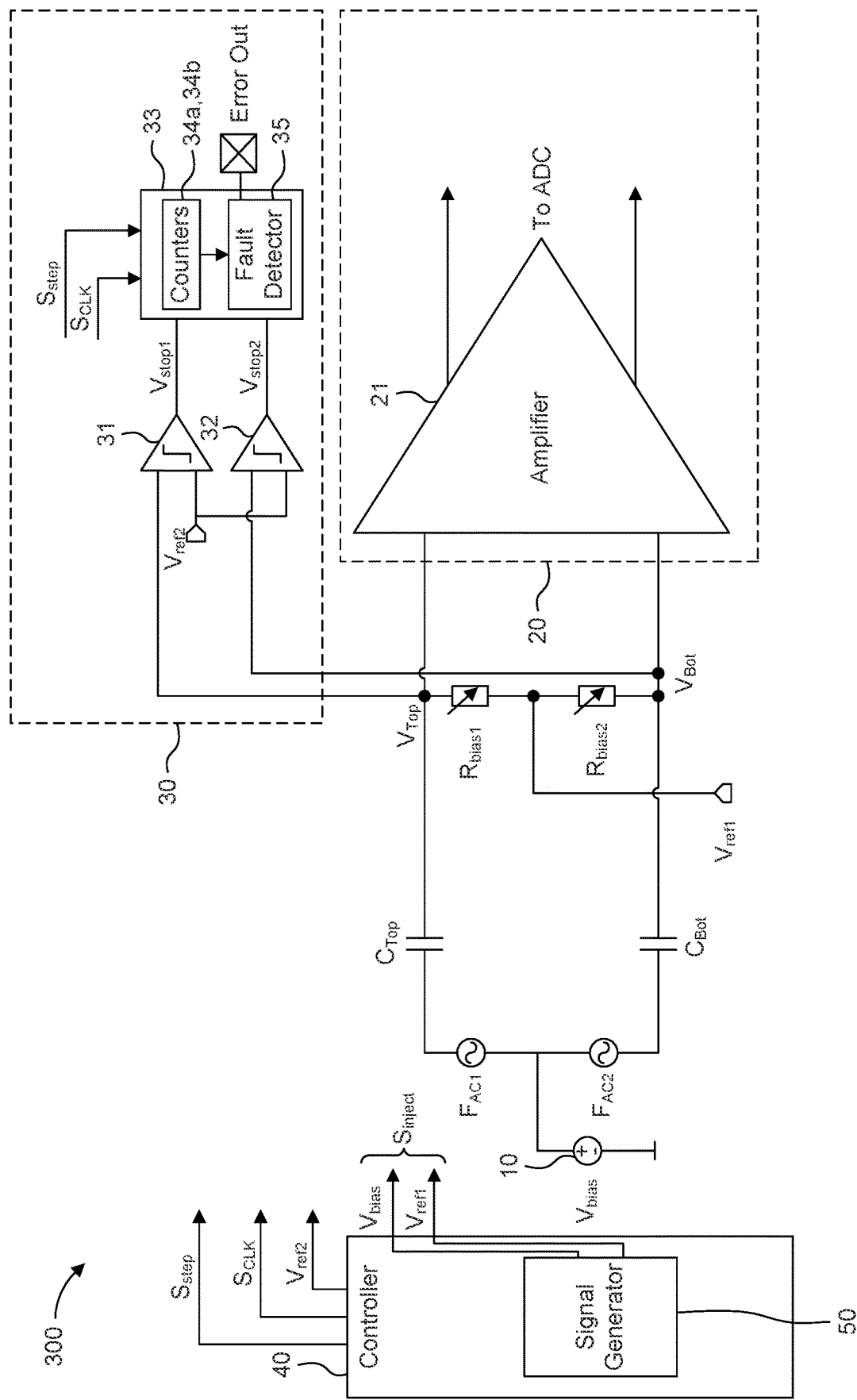
FIG. 3A is a schematic block diagram of a capacitive sensor read-out circuit according to one or more embodiments.
Figure 4A:
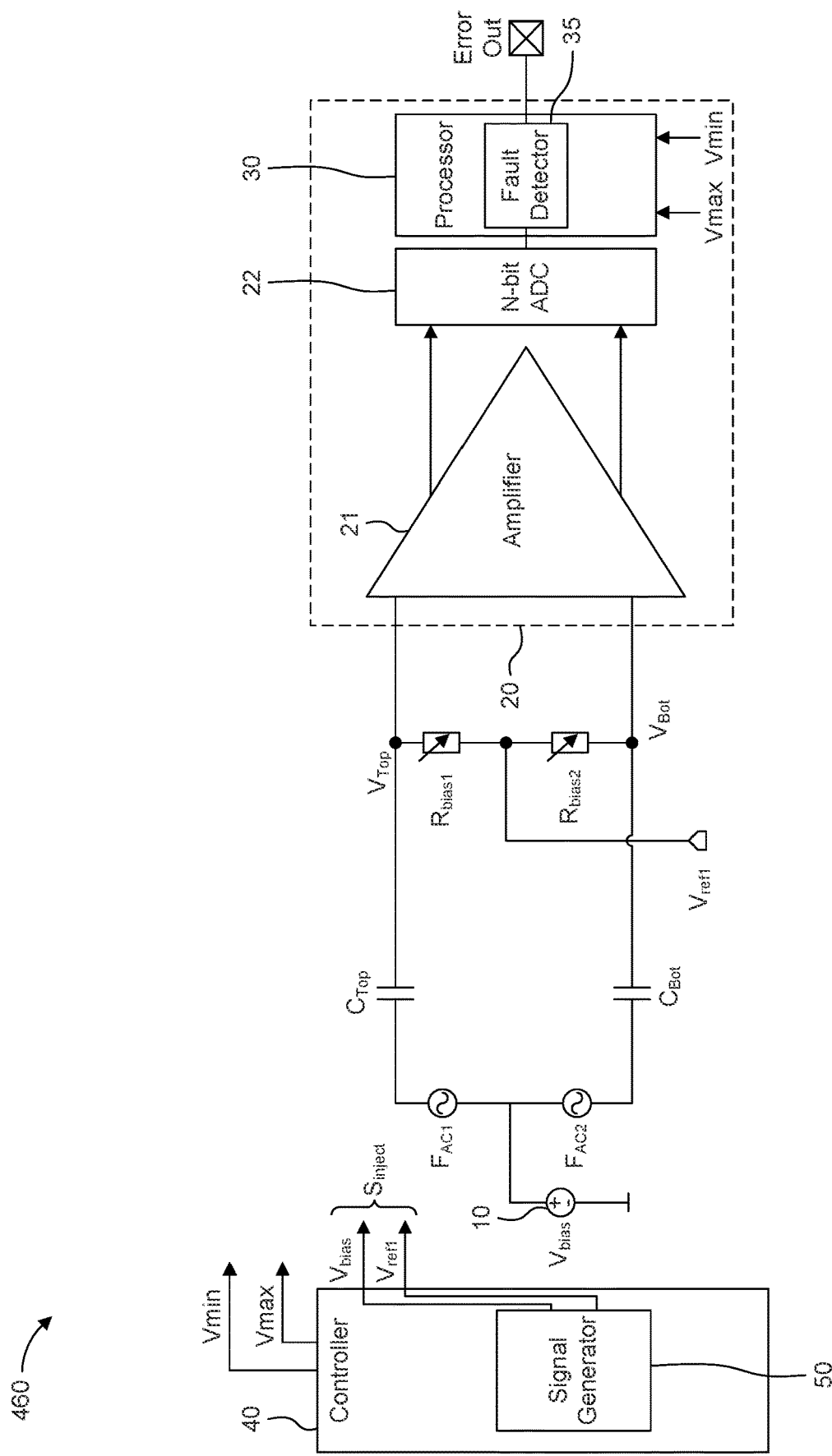
FIG. 4A is a schematic block diagram of another capacitive sensor read-out circuit according to one or more embodiments.
Figure 4B:
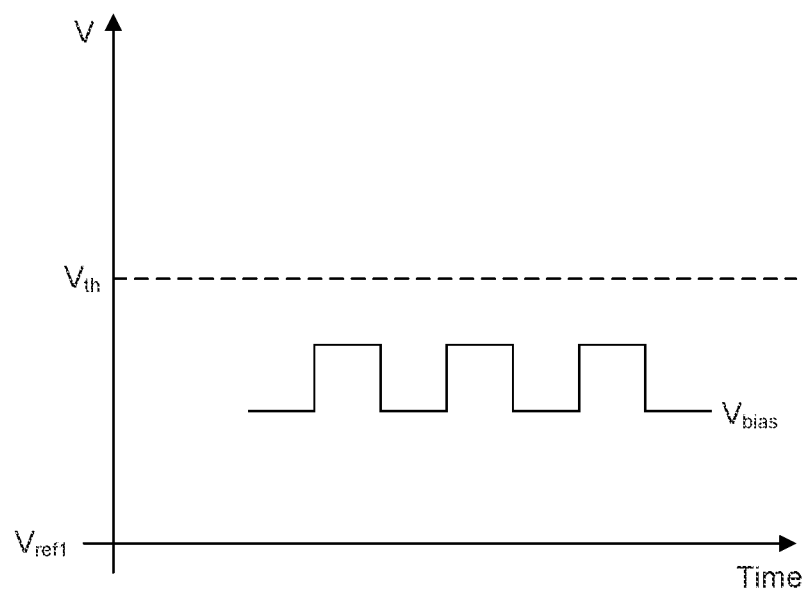
FIGS. 4B-4M are signal diagrams derived from the capacitive sensor read-out circuit of FIG. 4A using different locations for an injection node according to one or more embodiments.

FIG. 2 is a block diagram of a capacitive sensor 200 according to one or more embodiments. The capacitive sensor 200 includes MEMS element 11 and a signal processing circuit 20 that is configured to receive sensor signals Ssense (e.g., voltages Vtop and Vbot) from the MEMS element 11, perform signal processing thereon, and output the processed sensor signals as measurement signals Smeas at Signal Out. A readout circuit is provided between the MEMS element 11 and the signal processing circuit 20. The readout circuit receives signals from the MEMS element 11 and may include a biasing circuit (e.g., a resistive biasing circuit) for providing signals to the signal processing circuit 20. The readout circuit is shown in FIGS. 3A, 4A, and 4B. The capacitive sensor 200 also includes a failure diagnosis circuit 30 that is configured to receive the sensor signals Ssense and detect a one or more types of failures based thereon during a diagnosis operation. Failures may include one or more sensitivity failures of the MEMS element 11. In response to detecting a failure, the failure diagnosis circuit 30 is configured to generate an error signal Serr and output the error signal Serr at Error Out.

In order to detect an electrical failure, the failure diagnosis circuit 30 is configured to measure one of the electrical parameters affected by sensitivity failures, compare the electrical parameter to a predetermined error threshold or to a predetermined tolerance range having minimum and maximum thresholds, and generate the error signal Serr in response to the electrical parameter crossing (e.g., exceeding) the predetermined error threshold or deviating outside the predetermined tolerance range. An electrical parameter affected by a failure may be measured RC time constants of capacitors CTop and CBot (e.g., with respect to Rbias1 and Rbias2, respectively) in response to a capacitive diagnosis injection signal. The RC time constants are proportional and thus representative of the capacitances of the CTop and CBot. The capacitive diagnosis injection signal is configured to induce a pull-in event or to not induce a pull-in event, hereafter referred to as a pull-in injection signal and a non-pull-in injection signal, respectively. A capacitive diagnosis injection signal that is configured to induce a pull-in event (i.e., a pull-in injection signal) may be one that has a voltage that meets or exceeds a predetermined pull-in voltage threshold, whereas a capacitive diagnosis injection signal that is configured to not induce a pull-in event (i.e., a non-pull-in injection signal) may be one that has a voltage that is less than the predetermined pull-in voltage threshold.

The capacitances of the CTop and CBot can then be evaluated relative to a pull-in capacitance threshold and the type of injection signal. For example, if a pull-in injection signal is applied, it can be expected that a capacitance at one of CTop and CBot would be maximized and thereby meet or exceed the pull-in capacitance threshold. Should a pull-in capacitance not be measured in response to a pull-in injection signal, then an error can be detected. If a non-pull-in capacitance is detected in this scenario, then sensitivity was decreased either by a particle, a stiffening of the membrane 12, or by other means, for example.

Similarly, if a non-pull-in injection signal is applied, it can be expected that a neither capacitance at CTop and CBot would be maximized and thereby neither capacitance would meet or exceed the pull-in capacitance threshold. However, should a pull-in capacitance be measured at either CTop or CBot in response to a non-pull-in injection signal, then an error can be detected. If a pull-in capacitance is detected in this scenario, then sensitivity was increased because, for example, the membrane 12 has been weakened.

In essence, if a pull-in is attempted via a pull-in injection signal, it should result in a pull-in event. In contrast, if a non-pull-in is attempted via a non-pull-in injection signal, it should not result in a pull-in event. It is to be noted that a "non-pull-in" does not mean that the membrane 12 does not deflect towards one of the plates 13 or 14, but instead means that it does not pull-in to the extent where the membrane 12 makes contact with the isolation material 15 of one of the electrode structures. Thus, "pull-in" means that the membrane 12 is fully pulled into contact with one of the electrode structures and "non-pull-in" means that that the membrane 12 is not fully pulled into contact with either the electrode structures.

In an alternative embodiment of a capacitive sensor, elements 13 and 14 may be flexible conductive membranes and element 12 may be a fixed conductive plate with an isolation material 15 that encapsulates the conductive plate. In this embodiment, both membranes can experience a pull-in event at the same time as they are both drawn into contact of the isolation material 15 attached to element 12.

A failure will result in a shift of the corresponding measured electrical parameter at the output of the MEMS element 11 to shift outside a predetermined range or beyond an expected threshold. The failure diagnosis circuit 30 is configured to monitor for and detect these types of failures during a diagnosis operation.

The error signal Serr may be provided to a further diagnostic circuit (not illustrated) configured to perform further analysis on the capacitive sensor 200 to determine the cause or the source of the failure.

The capacitive sensor 200 further includes a controller 40 configured to perform a diagnosis operation on the MEMS element 11. The controller 40 also includes a signal generator 50 configured to inject one or more diagnosis signals Sinject into the MEMS circuitry (i.e., either at the input or output thereof). The injected signal Sinject induces a response (e.g., a pull-in event or a non-pull-in event) at the output of the capacitors CTop and CBot and the failure diagnosis circuit 30 is configured to measure the electrical parameters indicative of sensitivity faults based on the response to the injected signal Sinject. It will be appreciated that while the signal generator 50 is shown as being integrated with the controller 40, the two could be separate elements.

The injected signal Sinject includes at least one electrical signal step (e.g., a voltage step or a current step). Thus, the injected signal Sinject is a stepped signal and an electrical signal step is a signal transition from one signal level to a second level which induces a response at the output of the capacitors CTop and CBot. The signal transition may be a step-up transition (i.e., a rising edge) or a step-down transition (i.e., a falling edge).

For testing for sensitivity faults, the controller 40 may transmit either the injected signal Sinject or timing information thereof indicative of an injection time or trigger time of the injected signal or a component thereof to the failure diagnosis circuit 30. In particular, the failure diagnosis circuit 30 detects a trigger time of an electrical step (i.e., a rising edge or a falling edge between two predefined signal levels) of the injected signal Sinject or receives this trigger time directly from the controller 40. Alternatively, the failure diagnosis circuit 30 may be integrated with the controller 50 such that it knows the trigger time automatically.

In either case, the failure diagnosis circuit 30 may use a trigger time of an electrical signal step of the injected signal to calculate relevant RC time constants. For example, an RC time constant may be calculated starting at a time a corresponding electrical step was triggered by the signal generator 50 to a time a measured signal reaches a predefined threshold value. Accordingly, the failure diagnosis circuit 30 receives information that indicates the trigger time of an electrical step.

The controller 40 may also control the predefined threshold value used by comparator circuitry for measuring RC time constants. The time constant is the amount of time it takes for a capacitor's transient response to change from a first supply value to a certain percentage of the difference between first supply value and second supply value (i.e., a certain percentage of the delta supply change). In other words, it is the amount of time it takes the voltage across the capacitor to change from one extrema to a certain percentage of the difference between the first extrema and second extrema. The predefined threshold value is for the latter and represents the certain percentage of the difference between first extrema and second extrema. For example, the predefined threshold value may be set to approximately 63% of the delta supply change on a rising transient response for one time constant and may be set to approximately 37% of a delta supply change on a falling response transient for one time constant. Thus, the controller 40 may control the predefined threshold value used by the comparator circuitry for determining when the measured signal has reached a certain level after the trigger time for calculating the RC time constant.

Figure 3B:
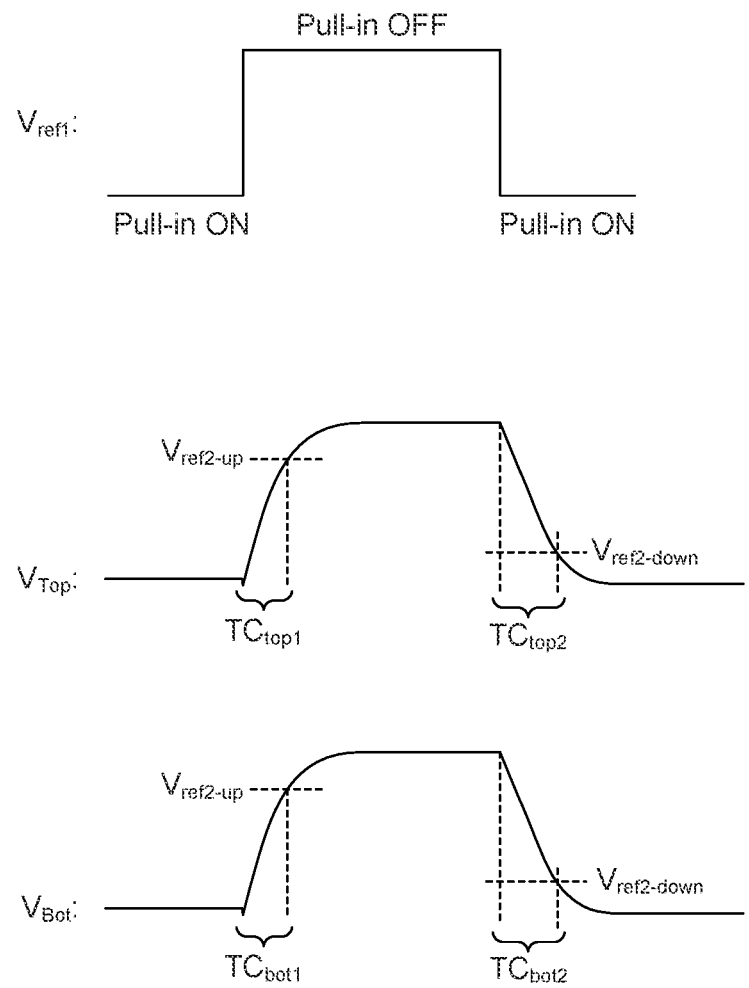
FIGS. 3B and 3C are signal diagrams derived from the capacitive sensor read-out circuit of FIG. 3A using different locations for an injection node according to one or more embodiments.
Figure 3C:
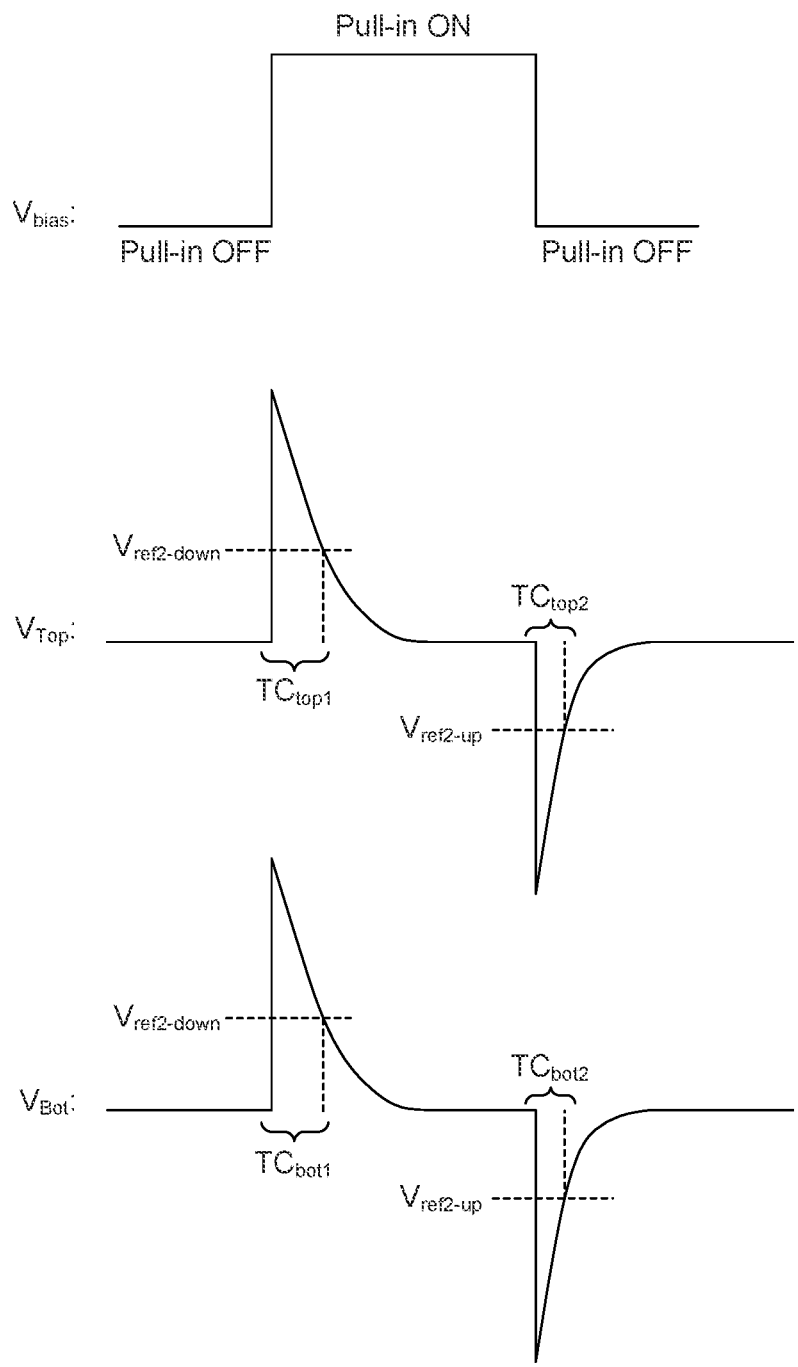

FIG. 3A is a schematic block diagram of a capacitive sensor read-out circuit 300 according to one or more embodiments. FIGS. 3B and 3C are signal diagrams derived from the capacitive sensor read-out circuit of FIG. 3A using different locations for an injection node according to one or more embodiments.

Different detection techniques can be used by modifying a location of the injection node at which an injection signal (i.e., an electrical signal step) is injected that induces a response at Vtop and Vbot and/or the type of injection signal (e.g., a voltage signal or a current signal). The read-out circuit 300 is a constant charge (CC) read-out circuit for reading out signals of a capacitive MEMS element (e.g., MEMS element 11). Thus, the charge of each capacitor CTop and CBot is held constant while the voltage across the capacitors is varied based on the change in capacitance. As will be explained below, the injection signal Sinject can be applied either at the input of the capacitors as a DC bias voltage Vbias or at the output of the capacitors as a reference voltage Vref1. It will be appreciated from FIGS. 3B and 3C that the pattern of the stepped injection signal depends on the location of the injection node. The other voltage (i.e., Vbias or Vref1) to which the injection signal is not applied is held constant.

A DC bias voltage supply 10 supplies a DC bias voltage Vbias to the conductive structures (i.e., the plate(s) and membrane(s)) of the MEMS element. AC external forces $F_{AC1}$ and $F_{AC2}$ are representative of external forces (e.g., pressure or acceleration) being applied and acting on the conductive structures, thereby causing a change in capacitance at capacitors CTop and/or CBot.

A differential amplifier 21, such as a differential programmable-gain amplifier or a differential buffer amplifier, is configured to receive the voltages Vtop and Vbot from the MEMS element as sensor signals and output a differential signal representative of the difference between voltages Vtop and Vbot. The differential amplifier 21 is part of the signal processing circuit 20 and may be the beginning of a signal processing chain thereof. For example, the differential amplifier 21 may be configured to receive the sensor signals (i.e., voltages Vtop and Vbot) and provide amplified sensor signals to a discrete time ADC that is arranged downstream along the signal processing chain of the signal processing circuit 20.

The voltages Vtop and Vbot at the MEMS element output is set via a very high-ohmic bias resistor Rbias1 and Rbias2, respectively, and a reference voltage Vref1. During a sensing operation, bias resistors Rbias 1 and Rbias2 are set at a very high-ohmic value to reduce noise present at the inputs of the amplifier 21. For example, the bias resistors Rbias1 and Rbias2 may be initially set anywhere between 1 Gohm and 500 Gohms depending on the noise suppression requirements and bandwidth requirements of the readout circuit. The higher the resistance, the higher the noise suppression that provides higher SNR. However, it is conceivable that other resistances could be used. In this example, bias resistors Rbias1 and Rbias2 are maintained to be equal or substantially equal and may be adjustable in order to reduce the sensor signals so that capacitive and/or sensitivity faults can be tested and detected.

Reference voltage Vref1 is input at a common node between the two bias resistors Rbias1 and Rbias2. The Vtop and Vbot DC voltages at the MEMS output are set by the reference voltage Vref1, after a charging time given by the resistive value of Rbias1 and Rbias2 and the time constants of Ctop and Cbot. However, if a sensitivity fault is present at one of the capacitors Ctop or Cbot, the time constants of Ctop and Cbot can be affected. For example, a larger capacitor typically has a longer transient response and thus a higher time constant. In contrast, a smaller capacitor typically has a shorter transient response and thus a lower time constant. Thus, the time constants of Ctop and Cbot can be measured and evaluated by the failure diagnosis circuit 30 to detect a capacitive or a sensitivity fault. In particular, the time constants of Ctop and Cbot can be measured by inducing a signal response at Vtop and Vbot, respectively, by an electrical signal step and measuring a rise time (i.e., a charging time) or a fall time (i.e., a discharging time) of Vtop and Vbot, respectively, against a corresponding time constant threshold value Vref2. The measured capacitances or time constants of Ctop and Cbot can then be evaluated based on expected values or expected ranges in view of whether a pull-in voltage is applied or not at one of the injection nodes.

The capacitive sensor read-out circuit 300 includes the controller 40 and the signal generator 50 that generate various control signals and injection signals used to perform the fault diagnosis. The controller 40 generates control signals, including: a clock signal SCLK, a time constant threshold signal Vref2 that sets the time constant threshold value Vref2 to be used by threshold comparators 31 and 32, an electrical step timing signal Sstep that indicates a time an electrical step is triggered, a configuration signal Vbias that controls supply of the DC bias voltage supply 10 to the MEMS element 11, a reference voltage signal Vref1 that controls the voltage level of Vref1, and configuration signals Rbias1 and Rbias2 that regulate (adjust) the resistive values of bias resistors Rbias1 and Rbias2.

The controller 40 may adjust the time constant threshold value Vref2 depending on the type of electrical signal step being injected and the injection point within the circuit. For example, Verf2 may be adjusted to Vref2_up for a transition in the injection signal that induces a capacitor charging function and may be adjusted to Vref2_down for a transition in the injection signal that induces a capacitor discharging function. It is also noted that while the controller 40 is shown as supplying the clock signal SCLK, a system clock may also generate and supply the clock signal SCLK.

The signal generator 50 generates an injection signal Sinject that has an electrical signal step of either a step up or a step down. The injection signal Sinject can be applied as a voltage step at node Vref1, as a voltage step at the DC bias voltage supply 10 as Vbias, or as a current step at nodes Vtop and Vbot. Applying the injection signal Sinject at node Vref1 produces a low-pass filter time evolution in the transient response of the capacitors Ctop and Cbot. Applying the injection signal Sinject at the DC bias voltage supply 10 as Vbias produces a high-pass filter time evolution in the transient response of the capacitors Ctop and Cbot.

The signal generator 50 generates an injection signal Sinject having one or more electrical signal steps. In the example of FIG. 3B, a two-step electrical signal step (i.e., a step-up and step-down) is injected at the node of Vref1. As used herein, a two-step electrical signal includes an electrical step up from a first signal level to a second signal level and an electrical step down from the second signal level to the first signal level. The triggering of the two electrical signal steps is separated by a predetermined amount of time, as controlled by the controller 40.

In the case of using Vref1 as the injection signal, a high voltage value corresponds to a non-pull-in voltage that should not induce a pull-in event at either Ctop, Cbot or both. In the case a high voltage value above a pull-in voltage threshold for Vref1, pull-in is turned OFF. On the other hand, a low voltage value corresponds to a pull-in voltage that should induce a pull-in event at either Ctop, Cbot or both. In the case a low voltage value is equal to or less than the pull-in voltage threshold for Vref1, pull-in is turned ON. Thus, the signal generator 50 can control Vref1 while Vbias is held constant to either induce a pull-in event or a non-pull-in event if the capacitive sensor is operating normally.

In FIG. 3B, Vref1, acting as the injection signal, is increased by the signal generator 50 from a first voltage level to a second, higher voltage level and causes the capacitors Ctop and Cbot to start charging. As a result, an exponential signal increase at both outputs Vtop and Vbot of capacitors Ctop and Cbot is induced by the electrical signal step as a transient response. It is expected that the capacitors Ctop and Cbot should not be fully pulled-in and that their capacitances are not at a pull-in capacitance, again, if the capacitive sensor is operating normally.

The failure diagnosis circuit 30 includes a threshold comparator 31 that compares output voltage Vtop to a time constant threshold value Vref2_up set by the system controller 40. The time constant threshold value Vref2_up may be set to a voltage value that corresponds to a time constant of capacitor Ctop and Cbot, the capacitance of which should be of substantially equal value absent any faults. The threshold comparator 31 is configured to receive Vtop and Vref2_up and change its output to Vstop1 when Vtop is equal to or greater than Vref2. For example, the threshold comparator 31 may change its output from 0 V to 5 V. The change in output indicates that capacitor Ctop charged to a point in response to the injection signal that Vtop crossed the time constant threshold value Vref2_up, which represents the time constant of capacitor Ctop. The output of Vstop1 stops a counter 34a that is assigned to capacitor Ctop and is used for measuring the time constant thereof.

Similarly, the failure diagnosis circuit 30 includes a threshold comparator 32 that compares output voltage Vbot to the time constant threshold value Vref2_up set by the system controller 40. The threshold comparator 31 is configured to receive Vbot and Vref2_up and change its output when Vbot is equal to or greater than Vref2_up. The threshold comparator 32 is configured to receive Vbot and Vref2_up and change its output to Vstop2 when Vbot is equal to or greater than Vref2. For example, the threshold comparator 32 may change its output from 0 V to 5 V. The change in output indicates that capacitor Cbot charged to a point in response to the injection signal that Vbot crossed the time constant threshold value Vref2_up, which represents the time constant of capacitor Cbot. The output of Vstop2 stops a counter 34b that is assigned to capacitor Cbot and is used for measuring the time constant thereof.

The failure diagnosis circuit 30 further includes a processing circuit 33 that includes a counters 34a, 34b that operate (i.e., count up) based on the clock signal SCLK. The counters 34a, 34b start at the time the electrical signal step is triggered. Thus, electrical step timing signal Sstep is a counter start signal received by the counters 34a, 34b to trigger the counters 34a, 34b to start counting.

Counter 34a is configured to stop counting when threshold comparator 31 outputs voltage Vstop1, indicating that Vtop crossed the time constant threshold value Vref2_up. The timed value of counter 34a at the time voltage Vstop1 is received represents the time constant TCtop1 of capacitor Ctop. Counter 34b is configured to stop counting when threshold comparator 32 outputs voltage Vstop2, indicating that Vbot crossed the time constant threshold value Vref2_up. The timed value of counter 34b at the time voltage Vstop2 is received represents the time constant TCbot1 of capacitor Cbot.

The processing circuit 33 of the failure diagnosis circuit 30 includes a fault detector 35 that is configured to compare both measured time constants TCtop1 and TCbot1 (e.g., final count values of the counters) to a predetermined threshold value. If either time constant TCtop1 and TCbot1 is equal to or greater than the predetermined pull-in threshold, then a pull-in event is detected at that capacitor (i.e., at least one of the capacitors is in a fully pulled-in state). If either time constant TCtop1 and TCbot1 is less than the predetermined pull-in threshold, then a pull-in event is not detected at that capacitor (i.e., the capacitor is not in a fully pulled-in state). In that case a non-pull-in event is detected.

If the fault detector 35 determines that either of the time constants TCtop1 and TCbot1 is equal to or greater than the predetermined pull-in threshold in response to Vref1 being set to a non-pull-in voltage, the fault detector 35 generates an error signal indicating a fault. Otherwise, the fault detector 35 determines that no fault is present at either capacitor Ctop or Cbot and may output a "no fault" signal.

In FIG. 3B, a second electrical step from a high value to a low value can be applied to attempt to induce a pull-in event at one or both capacitors Ctop and Cbot. Since the injection signal Sinject is a two-step electrical signal, the failure diagnosis circuit 30 is configured to measure the time constants of the capacitors Ctop and Cbot for each electrical signal step. As a result, the failure diagnosis circuit 30 will determine a first time constant TCtop1 for the electrical step up and a second time constant TCtop2 for the electrical step down for capacitor Ctop. Likewise, the failure diagnosis circuit 30 will determine a first time constant TCbot1 for the electrical step up and a second time constant TCbot2 for the electrical step down for capacitor Cbot.

Here, Vref1, acting as the injection signal, is decreased by the signal generator 50 from the second voltage level to the first, lower voltage level and causes the capacitors Ctop and Cbot to start discharging. As a result, an exponential signal decrease at both outputs Vtop and Vbot of capacitors Ctop and Cbot is induced by the electrical signal step as a transient response. It is expected that at least one of the capacitors Ctop and Cbot should be fully pulled-in and that at least one of the capacitances is at a pull-in capacitance, again, if the capacitive sensor is operating normally.

When applying a voltage step on the Ctop or Cbottom structure, because two different voltages on the capacitors may be applied, Vref2 voltage threshold is adjusted according to whether a positive step or negative step is applied. The controller 40 may be configured to adjust the voltage threshold value Vref2 according to the different signal steps. For example, the controller 40 may set the voltage threshold value Vref2 to a value Vref2_up for an increasing transient response and may set the voltage threshold value Vref2 to a value Vref2_down for a decreasing transient response. The values value Vref2_up and Vref2_down may be set to approximately 63% of the final voltage value of the capacitor during a charge or discharge step. The controller 40 may set the time constant threshold value Vref2 to the appropriate value at, for example, the time the corresponding electrical signal step is triggered.

The threshold comparator 31 generates a counter stop value when Vtop becomes equal to or less than Vref2_down in response to an electrical step down. Likewise, the threshold comparator 32 generates a counter stop value when Vbot becomes equal to or less than Vref2_down in response to an electrical step down. The counter values at counters 34a and 34b represent the corresponding time constants TCtop2 and TCbot2 in this scenario.

The fault detector 35 that is configured to compare both measured time constants TCtop2 and TCbot2 (e.g., final count values of the counters) to a predetermined threshold value. If either time constant TCtop2 and TCbot2 is equal to or greater than the predetermined pull-in threshold, then a pull-in event is detected at that capacitor (i.e., at least one of the capacitors is in a fully pulled-in state). If either time constant TCtop2 and TCbot2 is less than the predetermined pull-in threshold, then a pull-in event is not detected at that capacitor (i.e., the capacitor is not in a fully pulled-in state).

If the fault detector 35 determines that both of the time constants TCtop2 and TCbot2 are less than the predetermined pull-in threshold (i.e., indicating no pull-in event has occurred at either capacitor) in response to Vref1 being set to a pull-in voltage, the fault detector 35 generates an error signal indicating a fault. Otherwise, the fault detector 35 determines that no fault is present at either capacitor Ctop or Cbot and may output a "no fault" signal.

FIG. 3C illustrates using Vbias as a two-step electrical injection signal while Vref1 is held constant. In the case of using Vbias as the injection signal, a high voltage value corresponds to a pull-in voltage that should induce a pull-in event at either Ctop, Cbot or both. In the case a high voltage value above a pull-in voltage threshold for Vbias, pull-in is turned ON. On the other hand, a low voltage value corresponds to a non-pull-in voltage that should not induce a pull-in event at either Ctop or Cbot. In the case a low voltage value is equal to or less than the pull-in voltage threshold for Vref1, pull-in is turned OFF. Thus, the signal generator 50 can control Vbias while Vref1 is held constant to either induce a pull-in event or a non-pull-in event if the capacitive sensor is operating normally.

As before, the failure diagnosis circuit 30 uses threshold comparators 31 and 32 and counters 34a and 34b to measure the time constants of the capacitors Ctop and Cbot for each electrical signal step of Vbias. The counter values at counters 34a and 34b represent the corresponding time constants TCtop1, TCtop2, TCbot1, and TCbot2. It is noted that a capacitor charging takes place for a step-up in Vbias and a capacitor discharging takes place for a step-down in Vbias. Thus, reference voltage Vref2_down is used for determining time constants TCtop1 and TCbot1 and reference voltage Vref2_up is used for determining time constants TCtop2 and TCbot2. Nevertheless, the evaluation performed by the fault detector 35 is conceptually the same as above.

If either a time constant is equal to or greater than the predetermined pull-in threshold, then a pull-in event is detected at that capacitor (i.e., at least one of the capacitors is in a fully pulled-in state). If either time constant is less than the predetermined pull-in threshold, then a pull-in event is not detected at that capacitor (i.e., the capacitor is not in a fully pulled-in state).

If the fault detector 35 determines that either of the time constants TCtop1 and TCbot1 is equal to or greater than the predetermined pull-in threshold in response to Vbias being set to a pull-in voltage, the fault detector 35 determines that no fault is present at either capacitor Ctop or Cbot and may output a "no fault" signal. On the other hand, if the fault detector 35 determines that both of the time constants TCtop1 and TCbot1 are less than the predetermined pull-in threshold in response to Vbias being set to a pull-in voltage, the fault detector 35 determines that a fault is present and generates an error signal indicating a fault.

If the fault detector 35 determines that either of the time constants TCtop2 and TCbot2 is equal to or greater than the predetermined pull-in threshold in response to Vbias being set to a non-pull-in voltage, the fault detector 35 generates an error signal indicating a fault. Otherwise, the fault detector 35 determines that no fault is present at either capacitor Ctop or Cbot and may output a "no fault" signal.

It is to be noted further that TCtop1 and TCbot1 are expected to be smaller than TCtop2 and TCbot2 in FIG. 3B because pull-in causing the capacitance to be large is expected at the second signal step (i.e., with pull-in being turned ON). In contrast, TCtop1 and TCbot1 are expected to be larger than TCtop2 and TCbot2 in FIG. 3C because pull-in causing the capacitance to be large is expected at the first signal step (i.e., with pull-in being turned ON).

Figure 4C:
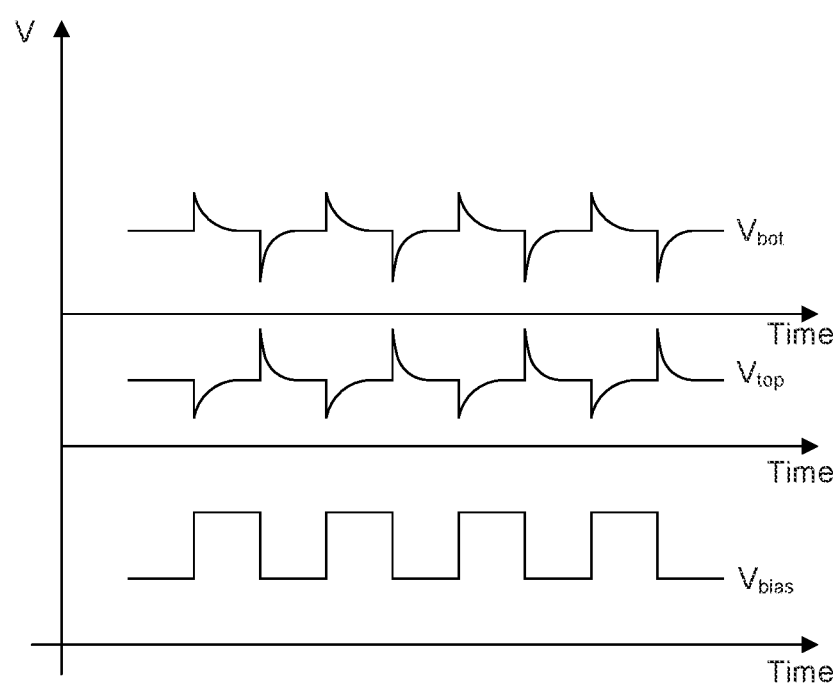
Figure 4D:
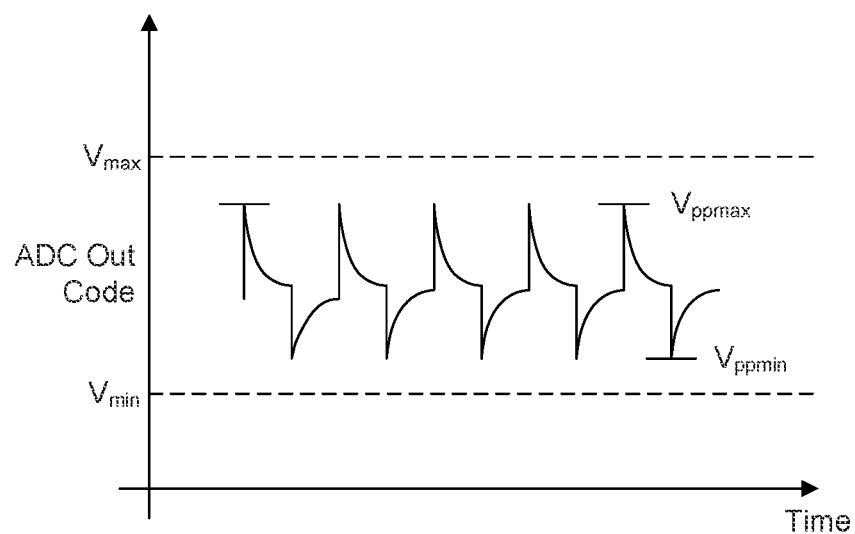
Figure 4E:
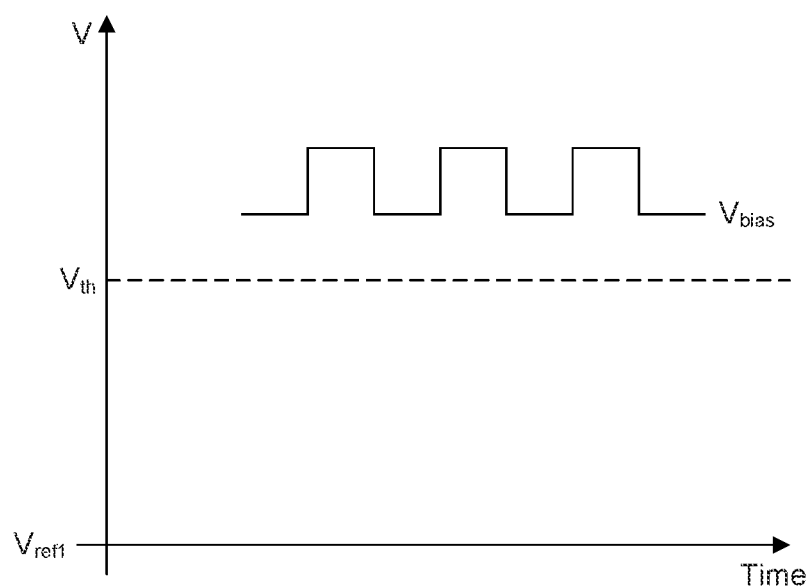
Figure 4F:
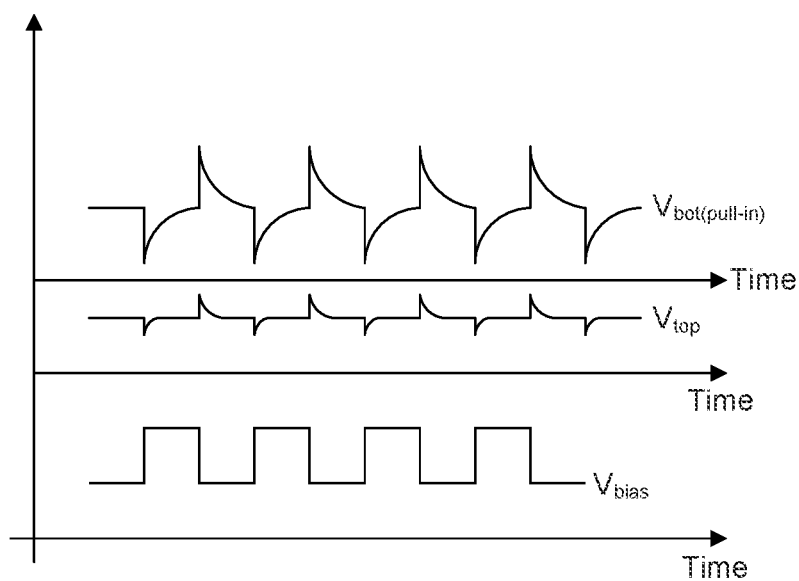
Figure 4G:
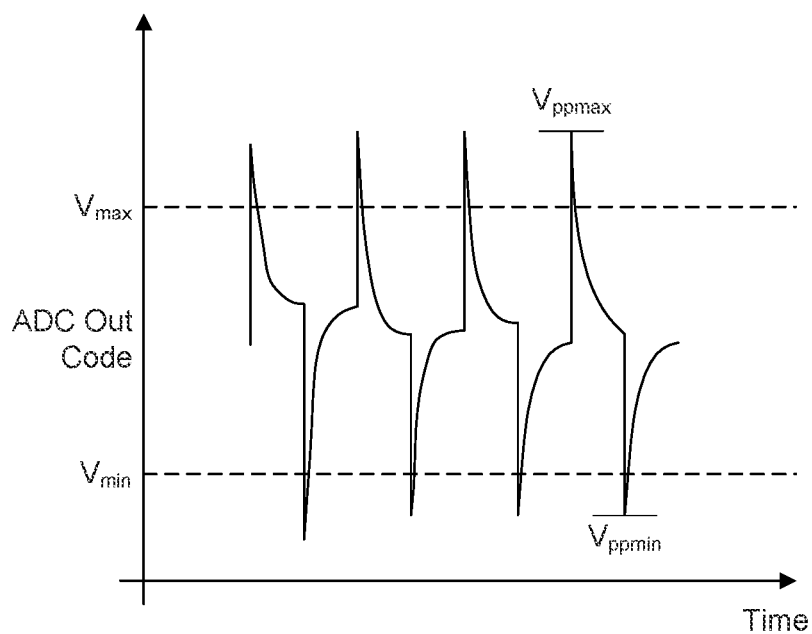
Figure 4H:
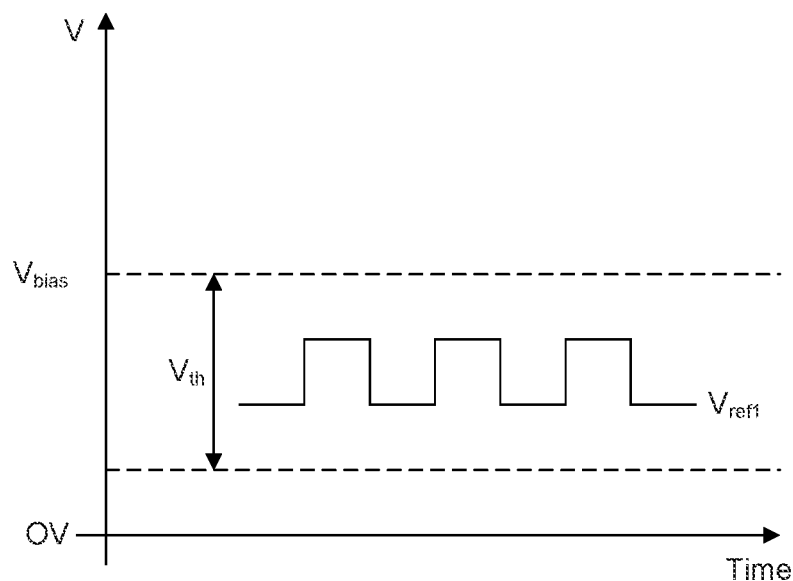
Figure 4I:
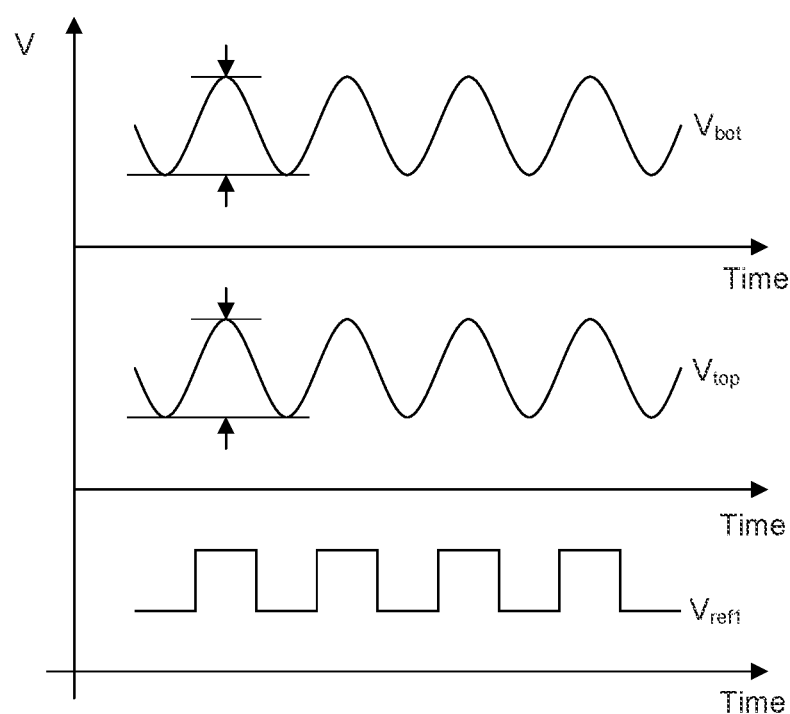
Figure 4J:
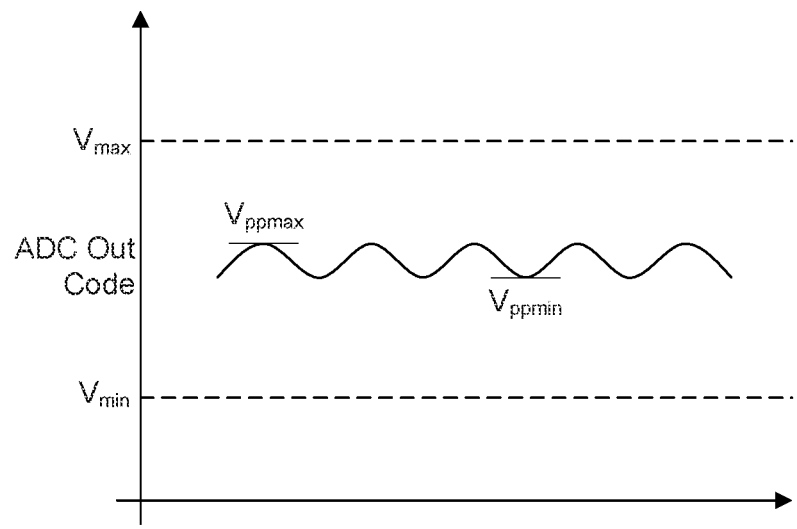
Figure 4K:
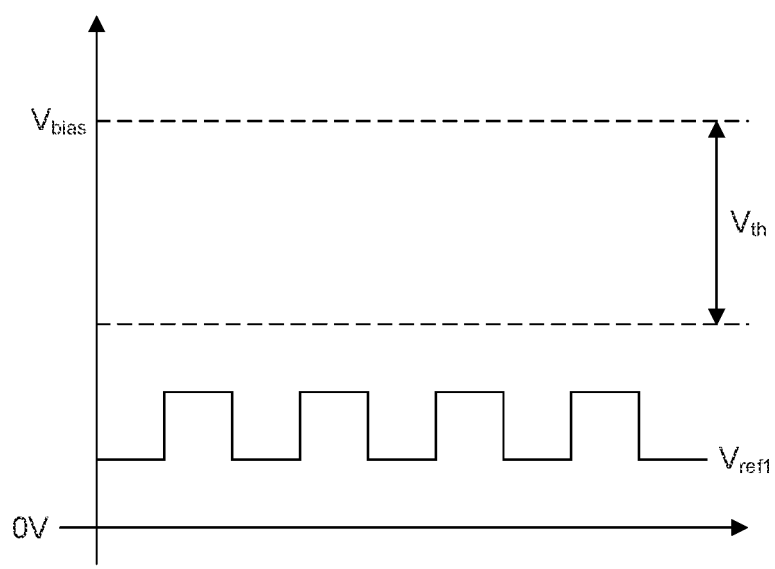
Figure 4L:
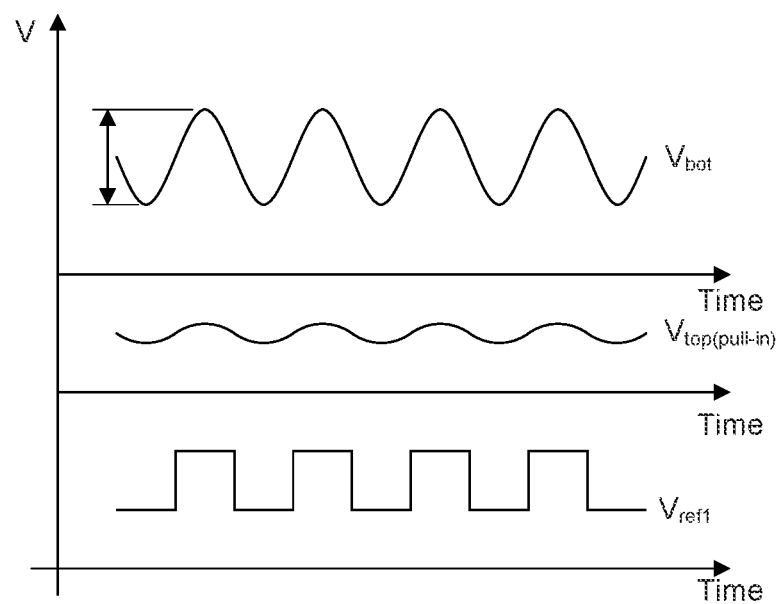
Figure 4M:
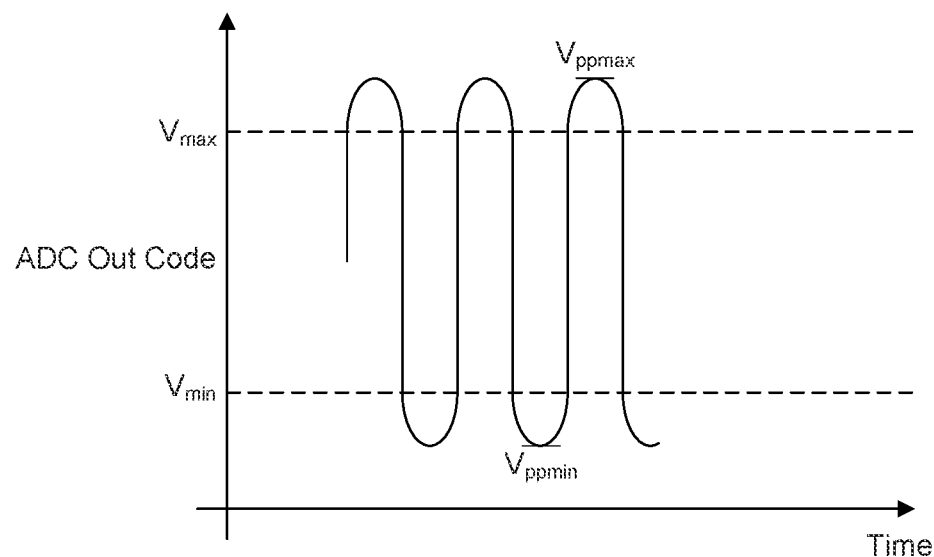

FIG. 4A is a schematic block diagram of another capacitive sensor read-out circuit 400 according to one or more embodiments. FIGS. 4B-4M are signal diagrams derived from the capacitive sensor read-out circuit of FIG. 4A using different locations for an injection node according to one or more embodiments. In particular, FIGS. 4B-4G are directed to using Vbias as the injection source (node) and FIGS. 4H-4M are directed to using Vref1 as the injection source (node). FIGS. 4B-4D are further directed to an alternating current (AC) non-pull-in injection signal, whereas FIGS. 4E-4G are further directed to an AC pull-in injection signal. FIGS. 4H-4J are further directed to an AC non-pull-in injection signal, whereas FIGS. 4K-4M are further directed to an AC pull-in injection signal.

In FIG. 4A, if the AC injection signal is applied at Vbias, AC signals at Vtop or Vbottom should normally be filtered if Rbias1, Rbias2, Ctop, and Cbot would be at typical, expected values (Ctop and Rbias1 or Cbottom and Rbias2 form a high-pass filter). But for a large capacitance at either Ctop, Cbot, or both as for the case when pull-in has occurred, the AC signal at Vtop or Vbottom is not filtered anymore by the filter. A peak-to-peak measurement can be performed in the digital domain. A comparison of the peak-to-peak measurement to pre-determined maximum and minimum thresholds Vmax and Vmin can be used to detect whether a pull-in injection signal results in a pull-in event and whether a non-pull-in injection signal results in a non-pull-in event, as expected, or whether a deviation from what is expected occurs that indicates a fault.

In FIG. 4A, if the AC injection signal is applied at Vref1, AC signals at Vtop or Vbottom should not normally be filtered if Rbias1, Rbias2, Ctop, and Cbot would be at typical, expected values (Ctop and Rbias1 or Cbottom and Rbias2 form a low-pass filter). But for a large capacitance at either Ctop, Cbot, or both as for the case when pull-in has occurred, the AC signal at Vtop or Vbottom is filtered by the filter (because capacitance increased). A peak-to-peak measurement can be performed in the digital domain. A comparison of the peak-to-peak measurement to pre-determined maximum and minimum thresholds Vmax and Vmin can be used to detect whether a pull-in injection signal results in a pull-in event and whether a non-pull-in injection signal results in a non-pull-in event, as expected, or whether a deviation from what is expected occurs that indicates a fault.

The AC injection signal is a pull-in injection signal when Vbias-Vref1 (i.e., the difference between Vbias and Vref1) is always greater than a pull-in threshold voltage Vth and the AC injection signal is a non-pull-in injection signal when Vbias-Vref1 is always smaller than the pull-in threshold voltage Vth.

In this case, the failure diagnosis circuit 30 is incorporated into the signal processing circuit 20. The signal processing circuit 20 includes the differential amplifier 20 that receives Vtop and Vbot at two input terminals and generates a differential signal representative of the difference between voltages Vtop and Vbot. The differential signal is provided to a discrete time N-bit ADC 22, where N is an integer greater than 1. The ADC 22 converts the differential signal into a digital signal (e.g., into digital values or digital codes) proportional to the amplitude of the differential signal.

The failure diagnosis circuit 30 is part of a signal processor of the signal processing chain that receives the digital signal from the ADC 22. The failure diagnosis circuit 30 includes a fault detector 35 that evaluates the digital signal against the pre-determined maximum and minimum thresholds Vmax and Vmin provided by the system controller 40 in view of the location of the injection node and the type of injection signal generated (i.e., a pull-in injection signal or a non-pull-in injection signal at Vbias or at Vref1).

If a non-pull-in injection signal is applied at either Vbias or at Vref1, the maximum peak Vppmax of the digital signal should be less than the pre-determined maximum threshold Vmax and the minimum peak Vppmin of the digital signal should be greater than the pre-determined minimum threshold Vmin. Alternatively, the difference between the Vppmax and Vppmin should be less than a pre-determined difference threshold. If a non-pull-in injection signal results in any of these conditions not being met, the fault detector 35 is configured to detect the unexpected condition and generate an error signal in response thereto.

If a pull-in injection signal is applied at either Vbias or at Vref1, the maximum peak Vppmax of the digital signal should be equal to or greater than the pre-determined maximum threshold Vmax and the minimum peak Vppmin of the digital signal should be equal to or less than the pre-determined minimum threshold Vmin. Alternatively, the difference between the Vppmax and Vppmin should be equal to or greater than a pre-determined difference threshold. If a pull-in injection signal results in any of these conditions not being met, the fault detector 35 is configured to detect the unexpected condition and generate an error signal in response thereto.

FIG. 4B illustrates the AC injection signal (Vbias) being applied as a non-pull-in injection signal while Vref1 is held to a fixed value, resulting in the output voltages Vtop and Vbot shown in FIG. 4C, and further resulting in a digital signal generated by the N-bit ADC 22 shown in FIG. 4D.

FIG. 4E illustrates the AC injection signal (Vbias) being applied as a pull-in injection signal, resulting in the output voltages Vtop and Vbot shown in FIG. 4F, and further resulting in a digital signal generated by the N-bit ADC 22 shown in FIG. 4G. In FIG. 4F, the peak-to-peak voltage of output voltage Vbot is large as a result of Cbot experiencing pull-in.

FIG. 4H illustrates the AC injection signal (Vref1) being applied as a non-pull-in injection signal while Vbias is held to a fixed value, resulting in the output voltages Vtop and Vbot shown in FIG. 4I, and further resulting in a digital signal generated by the N-bit ADC 22 shown in FIG. 4J.

FIG. 4K illustrates the AC injection signal (Vref1) being applied as a pull-in injection signal while Vbias is held to a fixed value, resulting in the output voltages Vtop and Vbot shown in FIG. 4L, and further resulting in a digital signal generated by the N-bit ADC 22 shown in FIG. 4M. In FIG. 4L, the peak-to-peak voltage of output voltage Vbot is large as a result of Ctop experiencing pull-in. In this case, Vtop and Vbot are the output of a low-pass filter and the output ripple of Vtop is getting smaller as the capacitor Ctop is getting larger as a result of the pull-in.

FIGS. 4I and 4L also demonstrate that in, a single capacitor configuration, that the extrema of the output voltage (e.g., Vbot or Vtop) can be compared to maximum and minimum threshold values for detecting a fault. For example, if the AC injection signal is a pull-in signal, the fault detection circuit 35 can detect a fault on a condition that the maximum peak voltage of the output voltage is less than a maximum threshold value and that the minimum peak voltage of the output voltage is greater than a minimum threshold value. Moreover, if the AC signal is a non-pull-in signal, the fault detection circuit 35 can detect a fault on a condition that the maximum peak voltage of the output voltage is equal to or greater than the maximum threshold value or the minimum peak voltage of the output voltage is equal to or less than the minimum threshold value.

FIGS. 4D, 4G, 4J, and 4M illustrate peak values Vppmax and Vppmin satisfying expected conditions with respect to Vmax and Vmin based on their respective AC injection signals. A deviation from any of the expected conditions is indicative of an error that can be detected by the fault detector 35.

FIGS. 4C and 4F also demonstrate that in, a single capacitor configuration, that the extrema of the output voltage (e.g., Vbot or Vtop) can be compared to maximum and minimum threshold values for detecting a fault. For example, if the AC injection signal is a pull-in signal, the fault detection circuit 35 can detect a fault on a condition that the maximum peak voltage of the output voltage is less than a maximum threshold value and that the minimum peak voltage of the output voltage is greater than a minimum threshold value. Moreover, if the AC signal is a non-pull-in signal, the fault detection circuit 35 can detect a fault on a condition that the maximum peak voltage of the output voltage is equal to or greater than the maximum threshold value and the minimum peak voltage of the output voltage is equal to or less than the minimum threshold value.

FIGS. 4I and 4L also demonstrate that in, a single capacitor configuration, that the extrema of the output voltage (e.g., Vbot or Vtop) can be compared to maximum and minimum threshold values for detecting a fault. For example, if the AC injection signal is a pull-in signal, the fault detection circuit 35 can detect a fault on a condition that the maximum peak voltage of the output voltage is less than a maximum threshold value and that the minimum peak voltage of the output voltage is greater than a minimum threshold value. Moreover, if the AC signal is a non-pull-in signal, the fault detection circuit 35 can detect a fault on a condition that the maximum peak voltage of the output voltage is equal to or greater than the maximum threshold value or the minimum peak voltage of the output voltage is equal to or less than the minimum threshold value.

Similarly, in a single capacitor configuration, the output voltage (e.g., Vbot or Vtop) responsive to the AC injection signal is a periodic signal having a maximum peak value and a minimum peak value that define a peak-to-peak value (i.e., a difference between the maximum peak value and a minimum peak value). If the AC injection signal is a pull-in signal applied at Vbias, the fault detection circuit 35 is configured to detect a fault on a first condition that the peak-to-peak value is less than a pull-in threshold value that corresponds to a pull-in capacitance. If the AC signal is a non-pull-in signal applied at Vbias, the fault detection circuit 35 is configured to detect a fault on a second condition that the peak-to-peak value is equal to or greater than the pull-in threshold value.

Similarly, in a single capacitor configuration, the output voltage (e.g., Vbot or Vtop) responsive to the AC injection signal is a periodic signal having a maximum peak value and a minimum peak value that define a peak-to-peak value (i.e., a difference between the maximum peak value and a minimum peak value). If the AC injection signal is a pull-in signal applied at Vref1, the fault detection circuit 35 is configured to detect a fault on a first condition that the peak-to-peak value is equal to or greater than a pull-in threshold value that corresponds to a pull-in capacitance. If the AC signal is a non-pull-in signal applied at Vref1, the fault detection circuit 35 is configured to detect a fault on a second condition that the peak-to-peak value is less than the pull-in threshold value.

While various embodiments have been described, it will be apparent to those of ordinary skill in the art that many more embodiments and implementations are possible within the scope of the disclosure. Accordingly, the invention is not to be restricted except in light of the attached claims and their equivalents.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

In summary, although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A capacitive sensor, comprising:
a first electrode structure;
a second electrode structure that is counter to the first electrode structure, wherein the second electrode structure is movable relative to the first electrode structure in response to an external force acting thereon, wherein the second electrode structure is capacitively coupled to the first electrode structure to form a first capacitor having a first capacitance that changes with a change in a distance between the first electrode structure and second electrode structure, wherein the first capacitance is representative of the external force,
wherein a pull-in event occurs when the first electrode structure is in direct contact with the second electrode structure causing the first capacitance to be equal to or greater than a pull-in capacitance and a non-pull-in event occurs when the first electrode structure is not in direct contact with the second electrode structure causing the first capacitance to be less than the pull-in capacitance;
a signal generator configured to apply a first electrical signal at an input or at an output of the first capacitor to induce a first voltage transient response at the output of first capacitor, wherein the first electrical signal is a pull-in signal configured to induce a pull-in event in the absence of a fault or a non-pull-in signal configured induce a non-pull-in event in the absence of a fault; and
a diagnostic circuit configured to detect a fault in the capacitive sensor by measuring a first time constant of the first voltage transient response and detecting the fault based on the first time constant and based on whether the first electrical signal is the pull-in signal or the non-pull-in signal.

2. The capacitive sensor of claim 1, wherein:
the diagnostic circuit is configured to compare the first time constant to a pull-in threshold value that corresponds to the pull-in capacitance,
when the first electrical signal is a pull-in signal, the diagnostic circuit is configured to detect a first fault on a first condition that the first time constant is less than the pull-in threshold value, and
when the first electrical signal is a non-pull-in signal, the diagnostic circuit is configured to detect a second fault on a second condition that the first time constant is equal to or greater than the pull-in threshold value.

3. The capacitive sensor of claim 1, wherein:
the pull-in event causes the first capacitance to be at a maximum capacitance and a non-pull-in event causes the first capacitance to be less than the maximum capacitance,
the diagnostic circuit is configured to determine whether the first time constant corresponds to the maximum capacitance,
when the first electrical signal is a pull-in signal, the diagnostic circuit is configured to detect a first fault on a first condition that the first time constant does not correspond to the maximum capacitance, and
when the first electrical signal is a non-pull-in signal, the diagnostic circuit is configured to detect a second fault on a second condition that the first time constant corresponds to the maximum capacitance.

4. The capacitive sensor of claim 1, wherein:
the first electrical signal, as the pull-in signal, includes a first signal step from a non-pull-in value to a pull-in value,
the first electrical signal, as the non-pull-in signal, includes a second signal step from the pull-in value to the non-pull-in value, and
the pull-in value is configured to induce the pull-in event in the absence of a fault and the non-pull-in value is configured to induce the non-pull-in event in the absence of a fault.

5. The capacitive sensor of claim 1, wherein the first electrode structure comprises a first conductive structure and an insulating layer arranged on a surface of the first conductive structure that faces the second electrode structure, and
the second electrode structure comprises a second conductive structure.

6. The capacitive sensor of claim 1, wherein the second electrode structure comprises a first conductive structure and an insulating layer arranged on a surface of the first conductive structure that faces the first electrode structure, and
the first electrode structure comprises a second conductive structure.

7. The capacitive sensor of claim 1, wherein the first electrical signal causes the first capacitor to charge to a maximum voltage or to discharge to a minimum voltage.

8. The capacitive sensor of claim 1, wherein:
the diagnostic circuit comprises a comparator, a counter, and a fault detector,
the comparator is configured to receive an output voltage representative of the first voltage transient response and compare the output voltage to a reference threshold in order to generate a comparison result having one of two comparator values,
the counter is configured to stop counting when the comparison result changes from a first comparator value to a second comparator value and output a stopped counter value representative of the first time constant,
the fault detector is configured to compare the stopped counter value to a pull-in threshold value that corresponds to the pull-in capacitance,
when the first electrical signal is a pull-in signal, the fault detector is configured to generate a first error signal in response to the stopped counter value being less than the pull-in threshold value, and
when the first electrical signal is a non-pull-in signal, the fault detector is configured to generate a second error signal in response to the stopped counter value being equal to or greater than the pull-in threshold value.

9. The capacitive sensor of claim 1, wherein:
the diagnostic circuit comprises a comparator and a fault detector,
the comparator is configured to receive an output voltage representative of the first voltage transient response, and compare the output voltage to a reference threshold in order to detect the first time constant, and
the fault detector is configured to compare the first time constant to a pull-in threshold value that corresponds to the pull-in capacitance,
when the first electrical signal is a pull-in signal, the fault detector is configured to generate a first error signal in response to the first time constant being less than the pull-in threshold value, and
when the first electrical signal is a non-pull-in signal, the fault detector is configured to generate a second error signal in response to the first time constant being equal to or greater than the pull-in threshold value.

10. The capacitive sensor of claim 9, wherein the diagnostic circuit comprises a counter configured to output a first counter value representative of the detected first time constant and the fault detector is configured to compare the first counter value to a pull-in threshold value that corresponds to the pull-in capacitance,
  when the first electrical signal is a pull-in signal, the fault detector is configured to generate a first error signal in response to the first counter value being less than the pull-in threshold value, and
  when the first electrical signal is a non-pull-in signal, the fault detector is configured to generate a second error signal in response to the first counter value being equal to or greater than the pull-in threshold value.

11. The capacitive sensor of claim 1, wherein:
  the diagnostic circuit is configured to compare the first time constant to a pull-in threshold value that corresponds to the pull-in capacitance,
  when the first electrical signal is a pull-in signal, the diagnostic circuit is configured to generate an error signal in response to the first time constant being less than the pull-in threshold value, and
  when the first electrical signal is a non-pull-in signal, the diagnostic circuit is configured to generate the error signal in response to the first time constant being equal to or greater than the pull-in threshold value.

12. The capacitive sensor of claim 1, further comprising a controller,
  wherein the first capacitor comprises a first terminal coupled to a bias supply voltage and a second terminal coupled to a DC voltage set by a bias resistive circuit, and
  wherein the controller is configured to control the signal generator to apply the first electrical signal at the first terminal by modulating the bias supply voltage or at the second terminal by modulating the DC voltage to induce the first voltage transient response.

13. A capacitive sensor, comprising:
  a first electrode structure;
  a second electrode structure that is counter to the first electrode structure, wherein the second electrode structure is movable relative to the first electrode structure in response to an external force acting thereon, wherein the second electrode structure is capacitively coupled to the first electrode structure to form a first capacitor having a first capacitance that changes with a change in a distance between the first electrode structure and second electrode structure, wherein the first capacitance is representative of the external force,
  wherein a pull-in event occurs when the first electrode structure is in direct contact with the second electrode structure causing the first capacitance to be equal to or greater than a pull-in capacitance and a non-pull-in event occurs when the first electrode structure is not in direct contact with the second electrode structure causing the first capacitance to be less than the pull-in capacitance;
  a signal generator configured to apply an alternating current (AC) signal at the first electrode structure or the second electrode structure of the first capacitor to induce an output response at an output of first capacitor, wherein the AC signal is a pull-in signal configured to induce a pull-in event in the absence of a fault or a non-pull-in signal configured induce a non-pull-in event in the absence of a fault; and
  a diagnostic circuit configured to detect a fault in the capacitive sensor by evaluating the output response and detecting the fault based on the output response and based on whether the AC signal is the pull-in signal or the non-pull-in signal.

14. The capacitive sensor of claim 13, wherein:
  the output response responsive to the AC signal is a periodic voltage having a maximum peak voltage and a minimum peak voltage,
  when the AC signal is a pull-in signal, the diagnostic circuit is configured to detect a first fault on a first condition that the maximum peak voltage is less than a maximum threshold value and that the minimum peak voltage is greater than a minimum threshold value, and
  when the AC signal is a non-pull-in signal, the diagnostic circuit is configured to detect a second fault on a second condition that the maximum peak voltage is equal to or greater than the maximum threshold value or the minimum peak voltage is equal to or less than the minimum threshold value.

15. The capacitive sensor of claim 13, wherein:
  the output response responsive to the AC signal is a periodic signal having a maximum peak value and a minimum peak value,
  when the AC signal is a pull-in signal, the diagnostic circuit is configured to detect a first fault on a first condition that the maximum peak value is less than a maximum threshold value and that the minimum peak value is greater than a minimum threshold value, and
  when the AC signal is a non-pull-in signal, the diagnostic circuit is configured to detect a second fault on a second condition that the maximum peak value is equal to or greater than the maximum threshold value or the minimum peak value is equal to or less than the minimum threshold value.

16. The capacitive sensor of claim 13, wherein:
  the output response responsive to the AC signal is a periodic voltage having a maximum peak voltage and a minimum peak voltage,
  when the AC signal is a pull-in signal, the diagnostic circuit is configured to detect a first fault on a first condition that the maximum peak voltage is greater than a maximum threshold value and that the minimum peak voltage is less than a minimum threshold value, and
  when the AC signal is a non-pull-in signal, the diagnostic circuit is configured to detect a second fault on a second condition that the maximum peak voltage is less than the maximum threshold value or the minimum peak voltage is greater than the minimum threshold value.

17. The capacitive sensor of claim 13, wherein:
  the output response responsive to the AC signal is a periodic signal having a maximum peak value and a minimum peak value,
  when the AC signal is a pull-in signal, the diagnostic circuit is configured to detect a first fault on a first condition that the maximum peak value is greater than a maximum threshold value and that the minimum peak value is less than a minimum threshold value, and
  when the AC signal is a non-pull-in signal, the diagnostic circuit is configured to detect a second fault on a second condition that the maximum peak value is less than the maximum threshold value or the minimum peak value is greater than the minimum threshold value.

18. The capacitive sensor of claim 13, wherein:
the output response responsive to the AC signal is a periodic signal having a maximum peak value and a minimum peak value that define a peak-to-peak value,
when the AC signal is a pull-in signal, the diagnostic circuit is configured to detect a first fault on a first condition that the peak-to-peak value is less than a pull-in threshold value that corresponds to a pull-in capacitance, and
when the AC signal is a non-pull-in signal, the diagnostic circuit is configured to detect a second fault on a second condition that the peak-to-peak value is equal to or greater than the pull-in threshold value.

19. The capacitive sensor of claim 13, wherein:
the output response responsive to the AC signal is a periodic signal having a maximum peak value and a minimum peak value that define a peak-to-peak value,
when the AC signal is a pull-in signal, the diagnostic circuit is configured to detect a first fault on a first condition that the peak-to-peak value is equal to or greater than a pull-in threshold value that corresponds to a pull-in capacitance, and
when the AC signal is a non-pull-in signal, the diagnostic circuit is configured to detect a second fault on a second condition that the peak-to-peak value is equal to or less than the pull-in threshold value.

20. A capacitive sensor, comprising:
a first electrode structure;
a second electrode structure that is counter to the first electrode structure, wherein the second electrode structure is movable relative to the first electrode structure, wherein the second electrode structure is capacitively coupled to the first electrode structure to form a first capacitor having a first capacitance that changes with a change in a distance between the first electrode structure and second electrode structure;
a third electrode structure that is counter to the first electrode structure, wherein the third electrode structure is movable relative to the first electrode structure, wherein the third electrode structure is capacitively coupled to the first electrode structure to form a second capacitor having a second capacitance that changes with a change in a distance between the first electrode structure and third electrode structure,
wherein a pull-in event occurs when the first electrode structure is in direct contact with the second electrode structure causing the first capacitance to be equal to or greater than a pull-in capacitance or when the third electrode structure is in direct contact with the second electrode structure causing the second capacitance to be equal to or greater than the pull-in capacitance,
wherein a non-pull-in event occurs when the first electrode structure is not in direct contact with the second electrode structure causing the first capacitance to be less than the pull-in capacitance and when the third electrode structure is not in direct contact with the second electrode structure causing the second capacitance to be less than the pull-in capacitance;
a differential amplifier configured to receive a first output signal from the first capacitor and a second output signal from the second capacitor, and generate a differential signal based on a difference between the first output signal and the second output signal;
a signal generator configured to apply an AC signal at an input or at an output of the first capacitor and at an input or at an output of the second capacitor to induce a first output response at the output of the first capacitor and to induce a second output response at the output of the second capacitor, respectively; and
a diagnostic circuit configured to detect a fault in the capacitive sensor by evaluating the differential signal and detecting the fault based on the differential signal and based on whether the AC signal is a pull-in signal or a non-pull-in signal.

21. The capacitive sensor of claim 20, wherein:
the first capacitor comprises a first terminal coupled to a bias supply voltage and a second terminal coupled to a first DC voltage set by a bias resistive circuit, and
the second capacitor comprises a first terminal coupled to the bias supply voltage and a second terminal coupled to a second DC voltage set by the bias resistive circuit.

22. The capacitive sensor of claim 20, wherein:
the differential signal responsive to the AC signal is a periodic voltage having a maximum peak voltage and a minimum peak voltage,
when the AC signal is a pull-in signal, the diagnostic circuit is configured to detect a first fault on a first condition that the maximum peak voltage is less than a maximum threshold value and that the minimum peak voltage is greater than a minimum threshold value, and
when the AC signal is a non-pull-in signal, the diagnostic circuit is configured to detect a second fault on a second condition that the maximum peak voltage is equal to or greater than the maximum threshold value or the minimum peak voltage is equal to or less than the minimum threshold value.

23. The capacitive sensor of claim 20, wherein:
the differential signal responsive to the AC signal is a periodic signal having a maximum peak value and a minimum peak value,
when the AC signal is a pull-in signal, the diagnostic circuit is configured to detect a first fault on a first condition that the maximum peak value is less than a maximum threshold value and that the minimum peak value is greater than a minimum threshold value, and
when the AC signal is a non-pull-in signal, the diagnostic circuit is configured to detect a second fault on a second condition that the maximum peak value is equal to or greater than the maximum threshold value or the minimum peak value is equal to or less than the minimum threshold value.

24. The capacitive sensor of claim 20, wherein:
the differential signal responsive to the AC signal is a periodic signal having a maximum peak value and a minimum peak value that define a peak-to-peak value,
when the AC signal is a pull-in signal, the diagnostic circuit is configured to detect a first fault on a first condition that the peak-to-peak value is less than a pull-in threshold value that corresponds to a pull-in capacitance, and
when the AC signal is a non-pull-in signal, the diagnostic circuit is configured to detect a second fault on a second condition that the peak-to-peak value is equal to or greater than the pull-in threshold value.

25. The capacitive sensor of claim 20, further comprising:
an analog-to-digital converter configured to receive and convert the differential signal into a digital signal, wherein the digital signal responsive to the AC signal is a periodic signal having a maximum peak value and a minimum peak value,
wherein, when the AC signal is a pull-in signal, the diagnostic circuit is configured to detect a first fault on a first condition that the maximum peak value is less than a maximum threshold value and that the minimum peak value is greater than a minimum threshold value, and wherein, when the AC signal is a non-pull-in signal, the diagnostic circuit is configured to detect a second fault on a second condition that the maximum peak value is equal to or greater than the maximum threshold value or the minimum peak value is equal to or less than the minimum threshold value.

26. The capacitive sensor of claim 20, further comprising:

an analog-to-digital converter configured to receive and convert the differential signal into a digital signal, wherein the digital signal responsive to the AC signal is a periodic signal having a maximum peak value and a minimum peak value that define a peak-to-peak value, wherein, when the AC signal is a pull-in signal, the diagnostic circuit is configured to detect a first fault on a first condition that the peak-to-peak value is less than a pull-in threshold value that corresponds to a pull-in capacitance, and wherein, when the AC signal is a non-pull-in signal, the diagnostic circuit is configured to detect a second fault on a second condition that the peak-to-peak value is equal to or greater than the pull-in threshold value.

* * * * *